(12) United States Patent
Shea et al.

(10) Patent No.: US 8,921,186 B2
(45) Date of Patent: Dec. 30, 2014

(54) SEMICONDUCTOR DEVICE AND METHOD OF FORMING HIGH VOLTAGE SOI LATERAL DOUBLE DIFFUSED MOSFET WITH SHALLOW TRENCH INSULATOR

(75) Inventors: Patrick M. Shea, Oviedo, FL (US); Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 960 days.

(21) Appl. No.: 12/467,157

(22) Filed: May 15, 2009

(65) Prior Publication Data

US 2009/0283826 A1    Nov. 19, 2009

Related U.S. Application Data

(60) Provisional application No. 61/053,566, filed on May 15, 2008.

(51) Int. Cl.
| | |
|---|---|
| H01L 29/78 | (2006.01) |
| H01L 21/336 | (2006.01) |
| H01L 29/10 | (2006.01) |
| H01L 29/66 | (2006.01) |
| H01L 29/06 | (2006.01) |
| H01L 29/08 | (2006.01) |
| H01L 29/40 | (2006.01) |
| H01L 29/417 | (2006.01) |
| H01L 29/423 | (2006.01) |
| H01L 23/00 | (2006.01) |

(52) U.S. Cl.
CPC ........ *H01L 29/7824* (2013.01); *H01L 29/1095* (2013.01); *H01L 29/66659* (2013.01); *H01L 29/66681* (2013.01); *H01L 29/7835* (2013.01); H01L 29/0653 (2013.01); H01L 29/0847 (2013.01); H01L 29/0878 (2013.01); H01L 29/1083 (2013.01); H01L 29/1087 (2013.01); H01L 29/402 (2013.01); H01L 29/41775 (2013.01); H01L 29/42368 (2013.01); H01L 2924/01078 (2013.01); H01L 2924/01079 (2013.01); H01L 2924/13091 (2013.01); H01L 2924/19041 (2013.01); H01L 2924/19042 (2013.01); H01L 2924/19043 (2013.01); H01L 2924/30105 (2013.01); H01L 2924/30107 (2013.01); H01L 24/13 (2013.01); H01L 2224/13147 (2013.01); H01L 2224/13155 (2013.01); H01L 2224/13644 (2013.01); H01L 2224/131 (2013.01)
USPC ....................................................... 438/286

(58) Field of Classification Search
USPC ........................................................ 438/286
See application file for complete search history.

(56) References Cited

U.S. PATENT DOCUMENTS

| | | | | |
|---|---|---|---|---|
| 5,132,753 A | * | 7/1992 | Chang et al. | 257/655 |
| 6,693,340 B1 | * | 2/2004 | Amaratunga et al. | 257/493 |

(Continued)

*Primary Examiner* — Matthew W Such
*Assistant Examiner* — Robert Carpenter
(74) *Attorney, Agent, or Firm* — Robert D. Atkins; Patent Law Group: Atkins and Associates, P.C.

(57) ABSTRACT

A semiconductor device has a buried oxide layer formed over a substrate. An active silicon layer is formed over the buried oxide layer. A drain region is formed in the active silicon layer. An LDD drift region is formed in the active silicon layer adjacent to the drain region. The drift region has a graded doping distribution. A co-implant region is formed in the active silicon. A source region is formed in the co-implant region. A shallow trench insulator is formed along a top surface of the LDD drift region. The shallow trench isolator has a length less than the LDD drift region. The shallow trench insulator terminates under the polysilicon gate and within the LDD drift region. A polysilicon gate is formed above the active silicon layer between the source region and LDD drift region and at least partially overlapping the shallow trench insulator.

12 Claims, 15 Drawing Sheets

(56) References Cited

U.S. PATENT DOCUMENTS

| | | | |
|---|---|---|---|
| 7,238,986 B2* | 7/2007 | Pendharkar et al. | 257/336 |
| 7,511,319 B2* | 3/2009 | Zhu et al. | 257/213 |
| 7,821,033 B2* | 10/2010 | Sedlmaier et al. | 257/192 |
| 2006/0163626 A1* | 7/2006 | Chen et al. | 257/288 |
| 2006/0255401 A1* | 11/2006 | Yang et al. | 257/328 |
| 2007/0085204 A1* | 4/2007 | Korec et al. | 257/737 |
| 2007/0200184 A1* | 8/2007 | Zhu et al. | 257/409 |
| 2008/0035994 A1* | 2/2008 | Jang | 257/339 |
| 2010/0207233 A1* | 8/2010 | Gambino et al. | 257/501 |

* cited by examiner

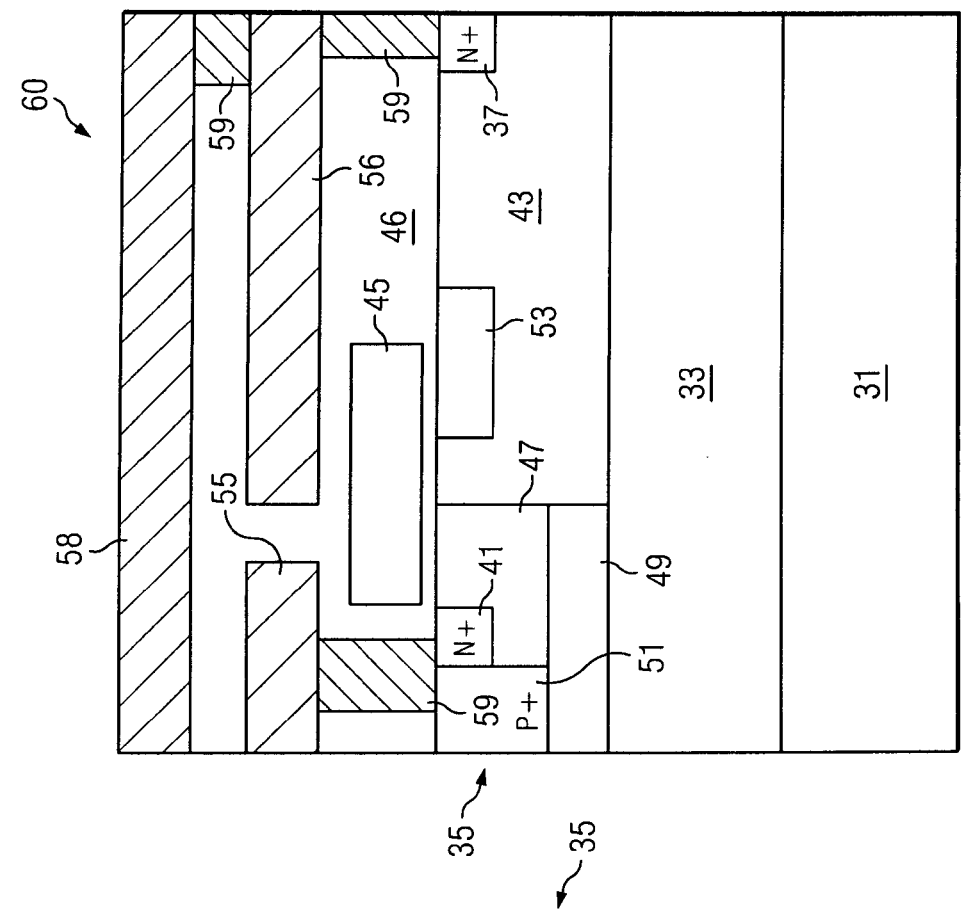
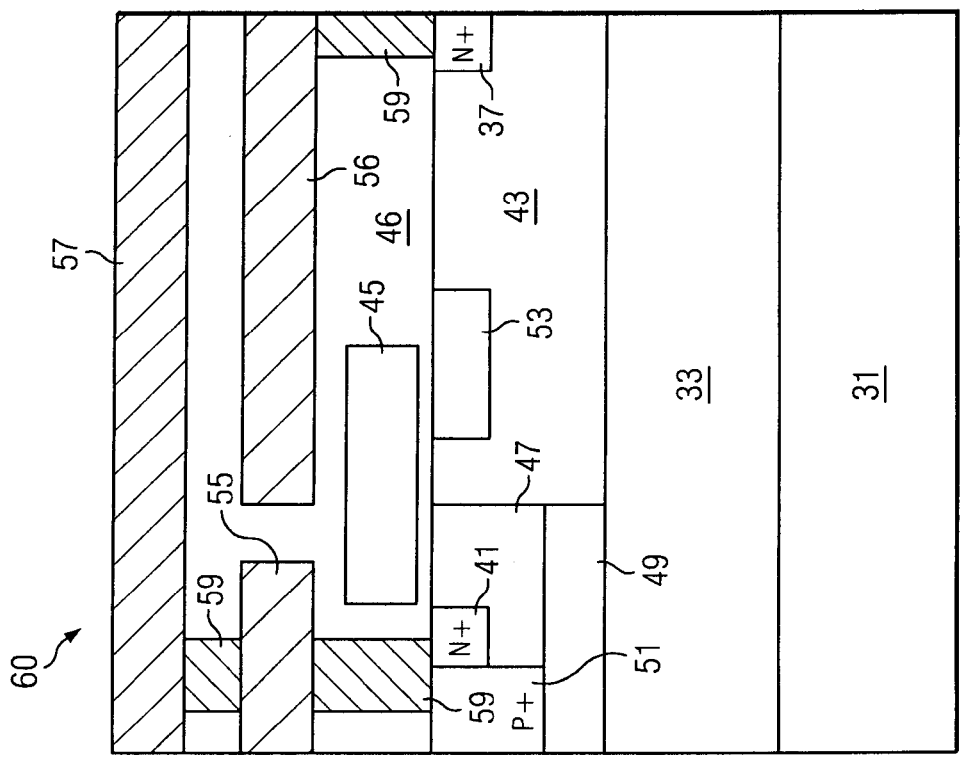
FIG. 8
FIG. 9

SEMICONDUCTOR DEVICE AND METHOD OF FORMING HIGH VOLTAGE SOI LATERAL DOUBLE DIFFUSED MOSFET WITH SHALLOW TRENCH INSULATOR

CLAIM TO DOMESTIC PRIORITY

The present non-provisional patent application claims priority to provisional application Ser. No. 61/053,566, entitled "High Voltage Silicon on Insulator Later Double Diffused Metal Oxyde Semiconductor with Shallow Trench Insulator," filed on May 15, 2008.

FIELD OF THE INVENTION

The present invention relates generally to electronic circuits and semiconductor devices, and more specifically to high power MOS devices for high frequency switching, and most specifically to lateral double diffused MOSFET structures.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

MOSFETs are commonly used in electronic circuits, such as communication systems and power supplies. Power MOSFETs are particularly useful when used as electric switches to enable and disable the conduction of relatively large currents. The on/off state of the power MOSFET is controlled by applying (or removing) a triggering signal at the gate electrode. When turned on, the electric current in the MOSFET flows between the drain and source.

In the design of power MOSFETS, there is a trade-off between maximizing the breakdown voltage and minimizing the on-resistance. A high drain-to-source breakdown voltage ($BV_{DSS}$) is desired because it indicates the maximum reverse voltage that can be applied across the device operating as a gated switch, i.e., without causing an exponential increase in current. At the same time, static drain-source on-resistance ($RDS_{ON}$) should be minimized to reduce power loss and heat dissipation when the switch is turned on. The $BV_{DSS}$ can be increased by providing a thicker or lightly doped drift region, however, these features lead to higher $RDS_{ON}$.

To further illustrate the $BV_{DSS}$ and $RDS_{ON}$ tradeoff, a conventional high voltage n-channel laterally diffused metal oxide semiconductor (LDMOS) is shown in FIG. 1. Semiconductor device 10 is built on a p-type substrate 11, and includes a highly doped n+ region at drain 13, laterally diffused drift region LDD2 adjacent the n+ drain region, and a lightly doped laterally diffused drift region LDD1 extending from the LDD2 region to gate 15. A highly doped n+ source region is formed at source 17. P+ plug is formed below the n+ source. A p-channel beneath gate 15 separates the source and drain. One difficulty with the design is that when the gate is energized, a high electric field occurs at the gate edge of LDD1, resulting in a lower $BV_{DSS}$. One way to reduce the electric field uses a lower doping concentration in LDD1, but that approach also increases $RDS_{ON}$.

In addition to optimizing $BV_{DSS}$ and $RDS_{ON}$, other challenges in MOSFET design (as well as the design of other types of semiconductors) include miniaturizing the devices, improving switching frequencies, reducing switching losses, and reducing undesirable phenomena such as floating body effects, punch-through, and parasitic capacitance.

One way of reducing parasitic capacitance involves silicon-on-insulator (SOI) technology. SOI refers to the use of a layered silicon-insulator-silicon substrate in place of conventional silicon substrates in semiconductor manufacturing, especially microelectronics. SOI-based devices differ from conventional silicon devices in that the silicon junction lies above a buried oxide (BOX) layer, typically silicon dioxide. FIG. 2 shows a typical SOI substrate 20. The base silicon or handling layer 21 serves primarily to provide structural support. BOX layer 23 is an insulating layer, and silicon layer 25 is the active layer of the device which may be customized using known fabrication technologies to create semiconductor dies.

SUMMARY OF THE INVENTION

A need exists to optimize $BV_{DSS}$ and $RDS_{ON}$ in a power MOSFET. Accordingly, in one embodiment, the present invention is a semiconductor device comprising a substrate and buried oxide layer formed over the substrate. An active silicon layer is formed over the buried oxide layer. A drain region is formed in the active silicon layer. A laterally double diffused (LDD) drift region is formed in the active silicon layer adjacent to the drain region. The LDD drift region has a graded doping distribution. A co-implant region is formed in the active silicon. A source region is formed in the co-implant region. A first shallow trench insulator is formed along a top surface of the LDD drift region. The first shallow trench insulator has a length less than the LDD drift region. A polysilicon gate region is formed above the active silicon layer between the source region and LDD drift region and at least partially overlapping the shallow trench insulator.

In another embodiment, the present invention is a method of making a semiconductor device comprising the steps of providing a substrate, forming a buried oxide layer over the substrate, forming an active silicon layer over the buried oxide layer, forming a drain region in the active silicon layer, and forming an LDD drift region in the active silicon layer adjacent to the drain region. The LDD drift region has a graded doping distribution. The method further includes the step of forming a co-implant region in the active silicon, forming a source region in the co-implant region, and forming a first shallow trench insulator along a top surface of the LDD drift region. The first shallow trench isolator has a length less than the LDD drift region. The method further includes the step of forming a polysilicon gate region above the active silicon layer between the source region and LDD drift region and at least partially overlapping the shallow trench insulator.

In another embodiment, the present invention is a method of making a semiconductor device comprising the steps of providing a substrate, forming an active silicon layer over the substrate, forming a drain region in the active silicon layer, forming an LDD drift region in the active silicon layer adjacent to the drain region, forming a source region in the active silicon layer, and forming a first shallow trench insulator along a top surface of the LDD drift region. The first shallow trench isolator has a length less than the LDD drift region. The method further includes the step of forming a gate region above the active silicon layer between the source region and LDD drift region and at least partially overlapping the shallow trench insulator.

In another embodiment, the present invention is a method of making a semiconductor device comprising the steps of providing a substrate, forming a drain region over the substrate, forming a drift region over the substrate adjacent to the drain region, forming a source region over the substrate, and forming a first shallow trench insulator along a top surface of the drift region. The first shallow trench isolator has a length less than the LDD drift region. The method further includes the step of forming a gate region above the substrate between the source region and drift region.

BRIEF DESCRIPTION OF THE DRAWINGS

FIG. 8 is a cross-sectional view showing metallization connections beneath a source bond pad;

FIG. 9 is a cross-sectional view showing metallization connections beneath a drain bond pad;

DETAILED DESCRIPTION OF THE DRAWINGS

Figure 1:
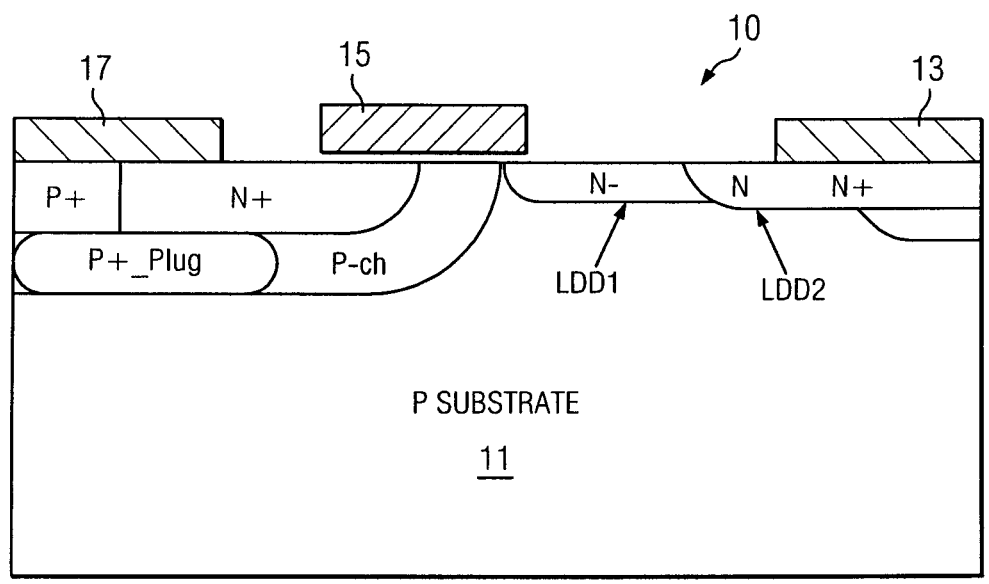
FIG. 1 is a cross-sectional view of a conventional high voltage LDMOS structure.
Figure 2:
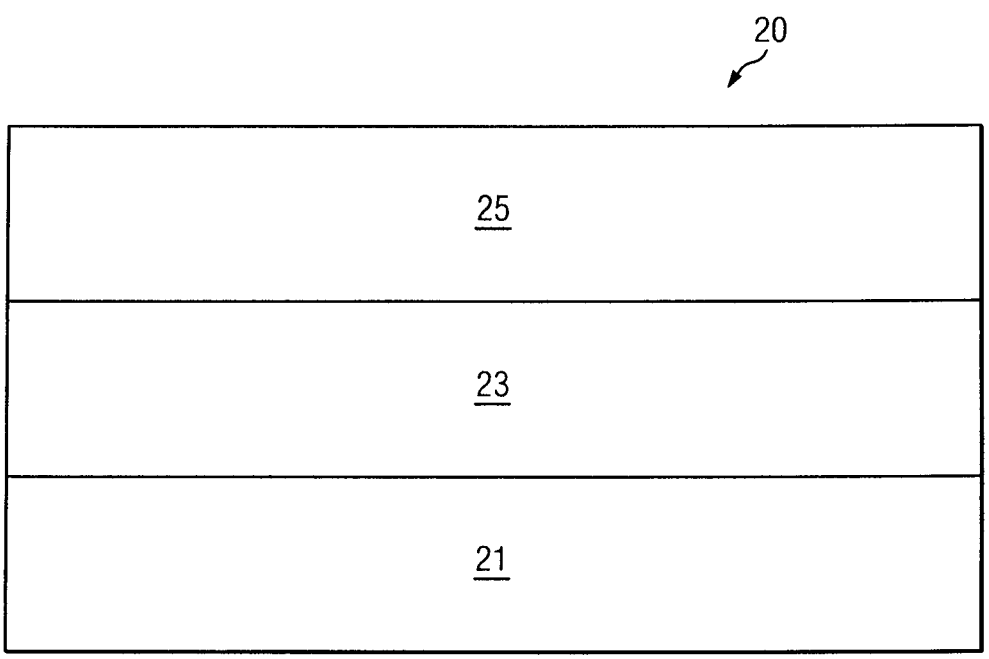
FIG. 2 is a cross-sectional view of a conventional silicon-on-insulator substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
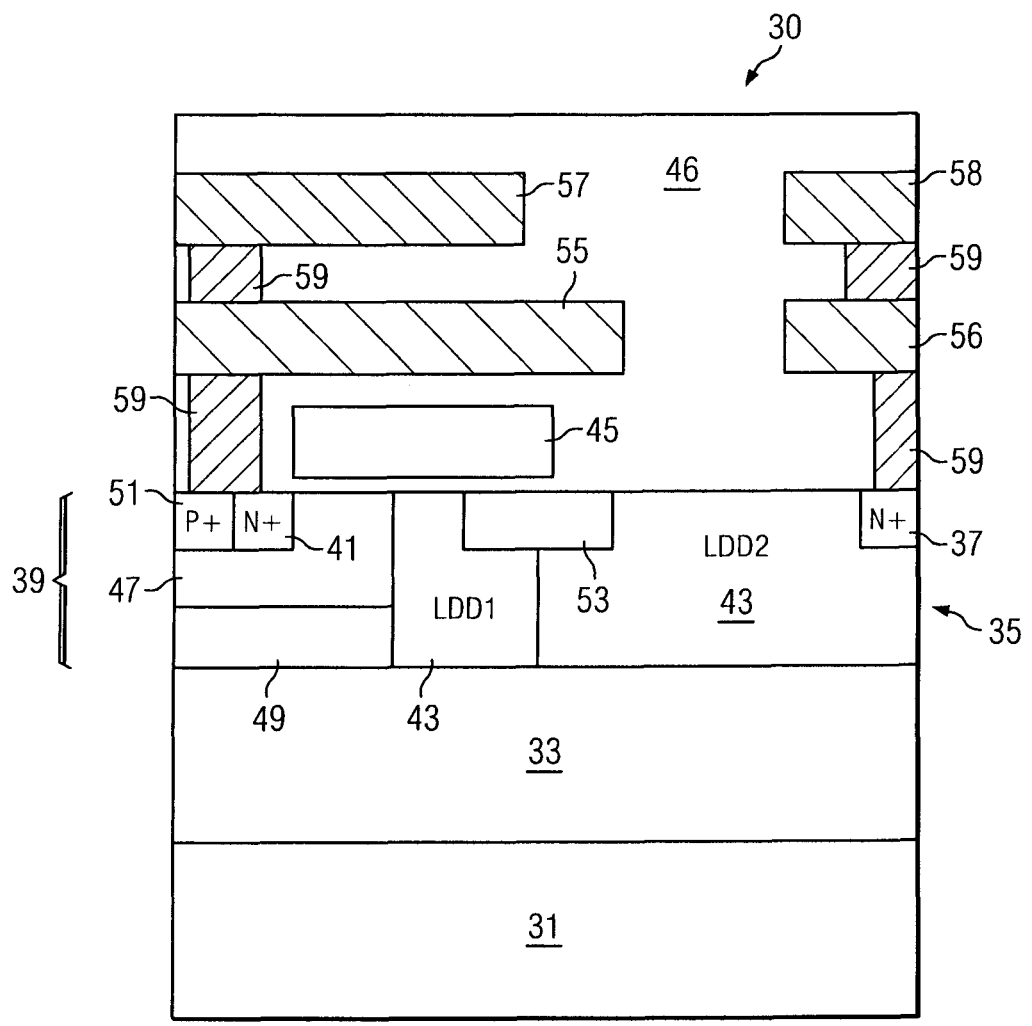
FIG. 3 is a cross-sectional view of a high voltage SOI lateral double diffused MOSFET with shallow trench insulator.

FIG. 3 is a cross-sectional view of semiconductor device 30. Semiconductor device 30 is a high voltage SOI lateral double diffused MOSFET with a shallow trench insulator (STI). The MOSFET can be an n-channel device (nmos) or a p-channel device (pmos), where "p" denotes a positive carrier type (hole) and "n" denotes a negative carrier type (electron). For purposes of illustration, the embodiments depicted hereinafter will be n-channel devices. Those skilled in the art will recognize that the principles may be applied equally to p-channel devices. Throughout the disclosure, the term "first carrier type" means either a p-type or an n-type material, and the term "second carrier type electrically opposite the first carrier type" means an n-type material if the first carrier type is p, and p-type material if the first carrier type is n.

Semiconductor device 30 can be fabricated on an SOI substrate having a base layer 31, BOX layer 33, and active silicon layer 35. Base layer 31 is an n-type handling layer, and provides structural support for the device. BOX layer 33 is an insulating material such as silicon dioxide, and separates active silicon layer 35 from base layer 31. Silicon layer 35 provides the active layer of the device. For semiconductor device 30, silicon layer 35 is a lightly doped p-type material. In one example, the SOI starting material has the following characteristics: Specification: <100> crystalline orientation, 725 μm overall thickness, (011) notch, 200 mm wafer diameter. Silicon layer 35: 1.0 μm thickness, p-type boron doping, 15-20 ohm-cm resistivity. BOX 33: 1 μm thickness. Base wafer: n-type, < or =1.0 ohm-cm resistivity.

A highly doped n+ drain region 37 is formed in silicon layer 35 and includes an ohmic contact. A co-implant region 39 is formed from p type material in active silicon layer 35. A highly doped n+ source region 41 is formed in region 39 and includes an ohmic contact. An LDD region 43 is formed in active silicon layer 35 adjacent to drain region 37.

The LDD region 43 can be formed from two lateral double diffused n-type layers LDD1 and LDD2. LDD1 and LDD2 region are formed by masking and ion implantation. After implantation, LDD1 and LDD2 are typically diffused together using a high-temperature thermal drive to create a graded, or gradual doping distribution across the drift region. Prior to thermal diffusion, LDD1 extends from n+ drain region 37 to co-implant region 39, and LDD2 extends from n+ drain region 37 part way along the length of LDD1, to cover only a portion of LDD1. In one embodiment, LDD2 has a higher doping concentration than LDD1, so that thermal diffusion will drive LDD2 ions laterally toward the source side, resulting in the highest n-type doping concentration occurring near the drain region, and the lowest n-type doping occurring opposite the drain region, with a transitional doping gradient across the LDD drift region.

The doping gradient in the drift region depends on the ion implant dose used for LDD1 and LDD2, and also on the size of the mask opening for the LDD2 implant. In one embodiment, the mask size and doping concentration of LDD1 is fixed, and the mask size and ion concentration of LDD2 is adjusted to optimize the doping gradient. By making the LDD2 mask size narrower or wider, or by increasing or decreasing the LDD2 ion dose, the $BV_{DSS}$ and $RDS_{ON}$ are selected for semiconductor device 30. The thermal drive is controlled to ensure that LDD2 laterally diffuses toward the source region to a desired degree, and to ensure that the LDD1 implant diffuses far enough under polysilicon gate region 45 to form a complete channel. In another embodiment, the mask size and doping concentration of LDD1 are adjustable.

Co-implant region 39 is formed with multiple layers of material of the same carrier type as active silicon layer 35. Co-implant region 39 is implanted to a depth that borders BOX layer 33. Co-implant region 39 contains a p-type base layer 47 formed over p+ buried layer 49. In one embodiment, p-type base layer 47 is a low-energy boron implant. By forming base layer 47 below gate region 45 adjacent to source region 41, the base layer can be configured to control the threshold or turn-on voltage of semiconductor device 30, and reduce punch-through effects near source region 41. The p+ buried layer 49 is formed as a high-energy, highly-doped boron layer implanted more deeply into co-implant region 39 than base layer 47, or alternatively, into the deepest portion of the base layer. The p+ buried layer 49 creates a high doping concentration along the surface of BOX layer 33 that is displaced far enough from gate region 45 so that the threshold voltage of the device is not significantly affected. A p+ plug 51 is formed adjacent to p-type base layer 47 and n+ source region 41. In one embodiment, p+ plug 51 extends to a top surface of active silicon layer 35. In any case, p+ buried layer 49 is electrically connected to source region 41, lowering the base resistance of semiconductor device 30. The design of co-implant region 39 increases the recombination rate in source region 41 when the device is under avalanche. As a result, the current gain of any parasitic n-p-n bipolar transistor in the MOSFET is reduced, which improves the current-handling capability (or safe operating area) of semiconductor device 30. The thickness of p+ buried layer 49 also reduces floating body effects. Generally, these features make semiconductor device 30 more rugged and better suited for use in applications such as high-power switching.

STI 53 is located along a top surface of drift region 43. STI 53 is formed, for example, by etching a trench about 0.25 μm deep into the thermally diffused LDD1+LDD2 channel, and filling the trench with an insulator, such as tetraethyl orthosilicate (TEOS) oxide, using a vapor deposition process. One edge of STI 53 terminates under gate region 45 and the other edge of STI 53 terminates within drift region 43. Accordingly, STI 53 has a length less than the length of the LDD drift region 43. In another embodiment, STI 53 is substantially centered below the drain side of gate region 45.

STI 53 allows a higher electric field to be sustained at the interface region between the drain and gate, which increases the $BV_{DSS}$ characteristic of semiconductor device 30 by allowing the electric field to form within STI 53 rather than within drift region 43. Because STI 53 can sustain a much higher electric field, it also increases the drain-to-gate breakdown voltage and protects semiconductor device 30 against voltage-induced failures or other electrical transients across the gate.

Generally, semiconductor device 30 confines STI 53 to an intermediate location in drift region 43 adjacent to gate region 45 where the gate-to-drain electric field is most intense, and where the STI is most effective in absorbing the electric field. By reducing the length of STI 53 to less than drift region 43 while still achieving a desired $BV_{DSS}$, the top surface of drift region 43 that is not covered by the STI provides more charge carriers and thereby reduce $RDS_{ON}$. STI 53 provides a significant advantage over prior art MOS devices that embed STI layers across substantially the entire top surface of the drift region.

Polysilicon gate region 45 is formed within an insulating layer 46 above active silicon layer 35. The insulating layer 46 can be made with silicon dioxide. In one embodiment, gate region 45 has a heavily doped n-type polysilicon layer underneath a tungsten silicide layer.

Source metal layers 55 and 57 and drain metal layers 56 and 58 are conductive layers that are formed within insulating layer 46 to connect drain region 37 and source region 41 to external input/output terminals. Source metal layers 55 and 57 connect electrically to source region 41, and drain metal layers 56 ad 58 connect electrically to drain region 37. Conductive metal pillars 59 provide vertical interconnect. The metal layers can be one or more layers of Al, Cu, Sn, Ni, Au, Ag, or other suitable electrically conductive material formed using patterning with PVD, CVD, sputtering, electrolytic plating, electroless plating process, or other suitable metal deposition process.

Source metal layer 55 and drain metal layer 56 are formed at a first elevation, and source metal layer 57 and drain metal layer 58 are formed at a second elevation which is different from the first elevation. Source metal layer 55 at the first elevation extends toward the drain, as shown, to act as a field plate. In this configuration, source metal layer 55 reduces the electric field across the gate oxide in the region where gate region 45 and drift region 43 overlap. In one embodiment, source metal layer 55 or drain metal layer 56 at least partially overlap polysilicon gate region 45 to realize the field plate effect. Source metal layer 57 and drain metal layer 58 function primarily to facilitate electrical connection to top side terminals (such as solder bumps), and may be configured to shorten the conduction path from the top side terminal to the corresponding metal layer at the first elevation to further reduce $RDS_{ON}$.

In one embodiment, semiconductor device 30 is fabricated using the following materials and typical doping levels:

| | | |
|---|---|---|
| p+ region 51 | boron | 1E18-1E20 ppcm$^3$ |
| n+ region 37 | phosphorus/arsenic | 1E18-1E20 ppcm$^3$ |
| n+ region 41 | phosphorus/arsenic | 1E18-1E20 ppcm$^3$ |
| p− region 47 | boron | 1E17-1E18 ppcm$^3$ |
| p+ region 49 | boron | 1E18-1E20 ppcm$^3$ |
| LDD1 | phosphorus | 1E15-1E17 ppcm$^3$ |
| LDD2 | phosphorus | 1E15-1E17 ppcm$^3$ |

Typical dimensions of semiconductor device 30 designed to achieve a $BV_{DSS}$ of 140 VDC are given as:

| | |
|---|---|
| A. source region 41 to LDD1 | 0.50 μm |
| B. base layer 47 to STI 53 | 0.75 μm |
| C. buried layer 49 to LDD2 | 4.50 μm |
| D. STI 53 | 1.75 μm |
| E. STI 53 overlap of gate 45 | 0.0-0.25 μm |
| F. LDD2 | 4.50 μm |

Dimensions B and D are measured prior to performing a 0.0-0.25 μm etch for dimension E. Dimension E is 0.0 μm when masking for an isotropic etch, anticipating about a 0.25 μm lateral trench. If an anisotropic etch is used to make the trench, dimension E has an overlap of about 0.25 μm.

Semiconductor device 30 is modeled as an n-channel MOSFET, conducting from the n+ drain region 37 through the n-type drift region 43 to source region 41. When a positive bias is applied to gate region 45, the device turns on, and an electron channel forms beneath gate region 45, which establishes a channel between drift region 43 and source region 41, allowing current to flow between drain and source. Advantages of fabricating the MOSFET as described above are most apparent in high power switching applications. The realization of $BV_{DSS}$>150 VDC, $RDS_{ON}$<100 milliohms, and low gate charge, all within an active device area of 9 mm$^2$ enables higher switching frequencies without incurring higher reverse-recovery switching losses. Higher switching frequencies make possible the further miniaturization of all other components in the power supply.

Figure 4:
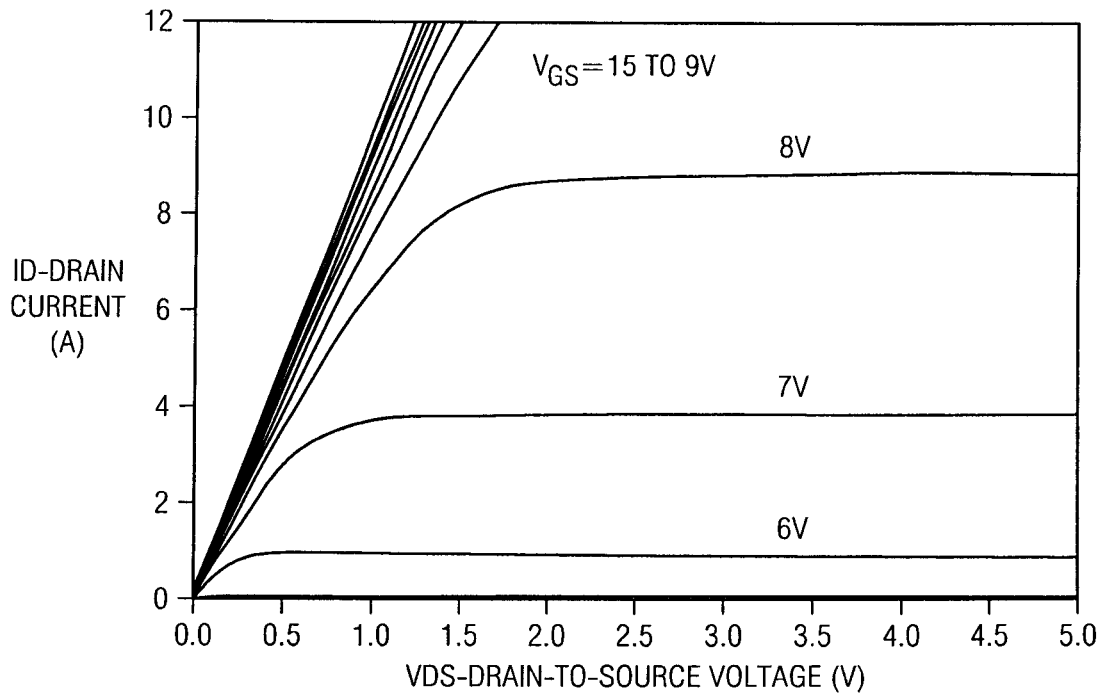
FIG. 4 is a graph of drain current and drain-to-source voltage for different values of gate-to-source voltage ($V_{GS}$)
Figure 5:
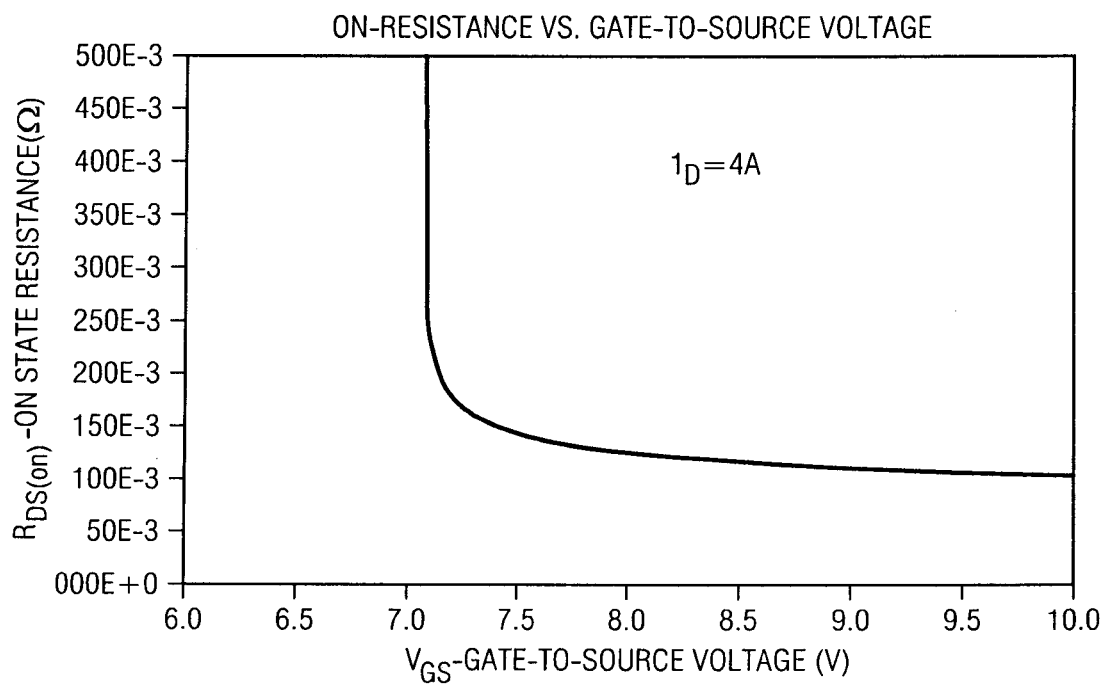
FIG. 5 is a graph of $RDS_{ON}$ and $V_{GS}$ for a drain current of 4 amps.
Figure 6:
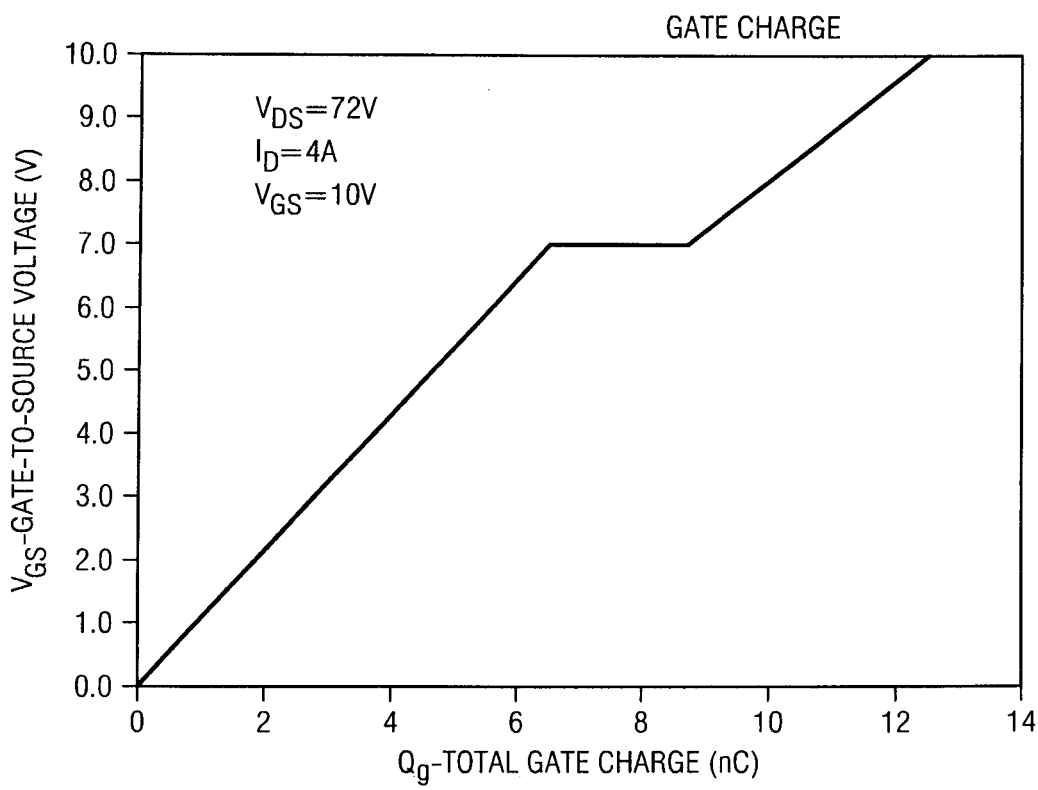
FIG. 6 is a graph showing typical gate charge characteristics.

The graphs shown in FIGS. 4 through 6 were created from data obtained from tests conducted on devices fabricated according to the methods and materials disclosed herein. The devices tested are fabricated on dies having an active device area of 9 mm$^2$.

FIG. 4 is a graph of drain current and drain-to-source voltage in a typical device for different values of gate-to-source voltage ($V_{GS}$). The linear region of the curve indicates typical values of $RDS_{ON}$.

FIG. 5 is a graph of $RDS_{ON}$ and $V_{GS}$ in a typical device for a drain current of 4 amps. The graph indicates $RDS_{ON}$ approaching less than 100 milliohms at elevated levels of gate-to-source voltage.

FIG. 6 is a graph showing typical gate charge characteristics. The plateau area near the top of the curve at $V_{GS}$=7.0 V indicates a very low gate-to-drain charge due to minimizing the overlap between the gate and laterally diffused region, and minimizing the doping concentration of the laterally diffused region under the overlap through use of the thermal diffusion and selection of LDD doping concentrations and mask sizes.

Figure 7:
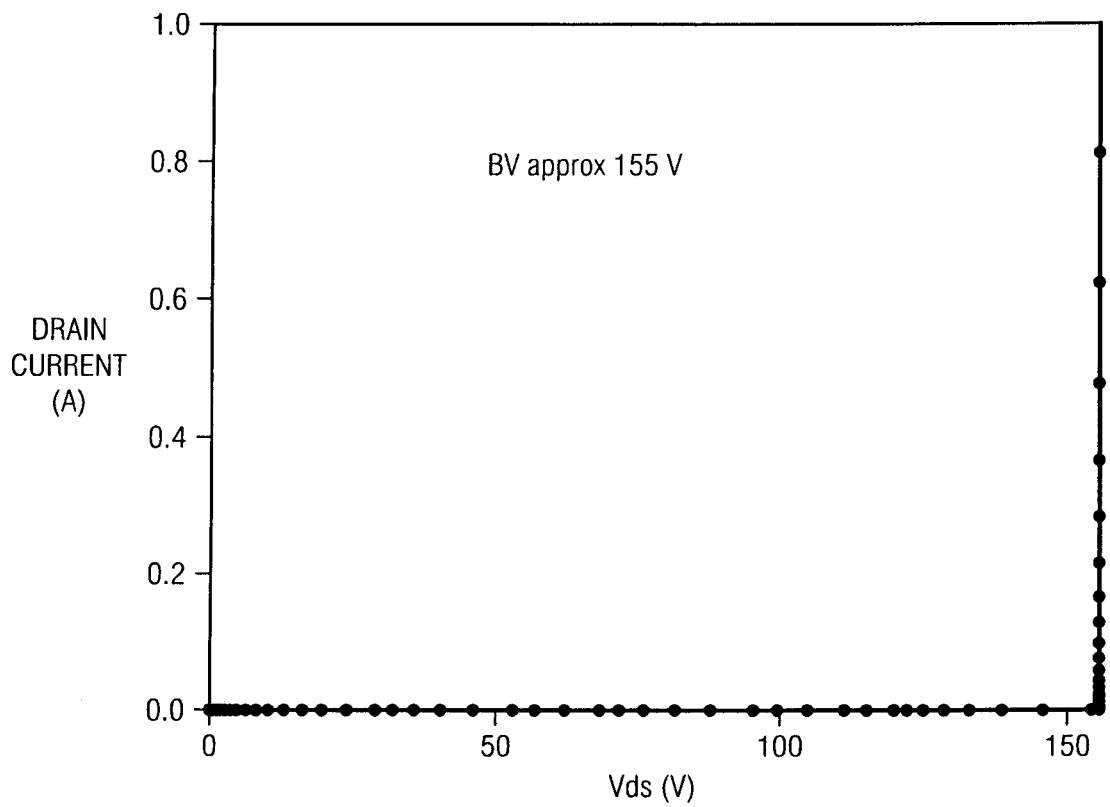
FIG. 7 is a graph showing typical breakdown voltage characteristics.

FIG. 7 is a graph showing typical breakdown voltage characteristics. The results, generated by a device simulator, indicate $BV_{DSS}$ may exceed 150 VDC in a 9 mm$^2$ active device area.

FIGS. 8 through 11 illustrate an arrangement of multiple semiconductor devices 30 in a die array, with connection of the devices to source and drain bond pads located on top of the die. FIG. 8 is a cross-sectional view of one embodiment of semiconductor device 60 showing metallization connections beneath a source bond pad. Semiconductor device 60 is fabricated similarly to semiconductor device 30 as previously described, and occupies space on the order of about 10 µm. The drift region 43 is shown in its thermally diffused state, i.e., having a graded doping distribution. A source bond pad (not shown) lies atop the device and is electrically connected to source metal layer 57 at the second elevation. Thus, in the cross section of the die, a portion of drain metal layer 56 at the first elevation lies in the cross-sectional plane, while drain metal layer 58 at the second elevation does not.

FIG. 9 shows a cross-sectional view of semiconductor device 60, having moved the perspective of FIG. 8 in a direction normal to page, i.e., further into the die array to the area under a drain bond pad. A drain bond pad (not shown) lies atop the device and is electrically connected to drain metal layer 58 at the second elevation. In the cross section of the die, a portion of source metal layer 55 at the first elevation lies in the cross-sectional plane, while the source metal layer 57 does not. From FIG. 9, if the perspective moves still further into the page to the next device, the arrangement of FIG. 8 will occur again, and the pattern of alternating source and drain bond pads will repeat until the perspective reaches the end of the die.

Figure 10:
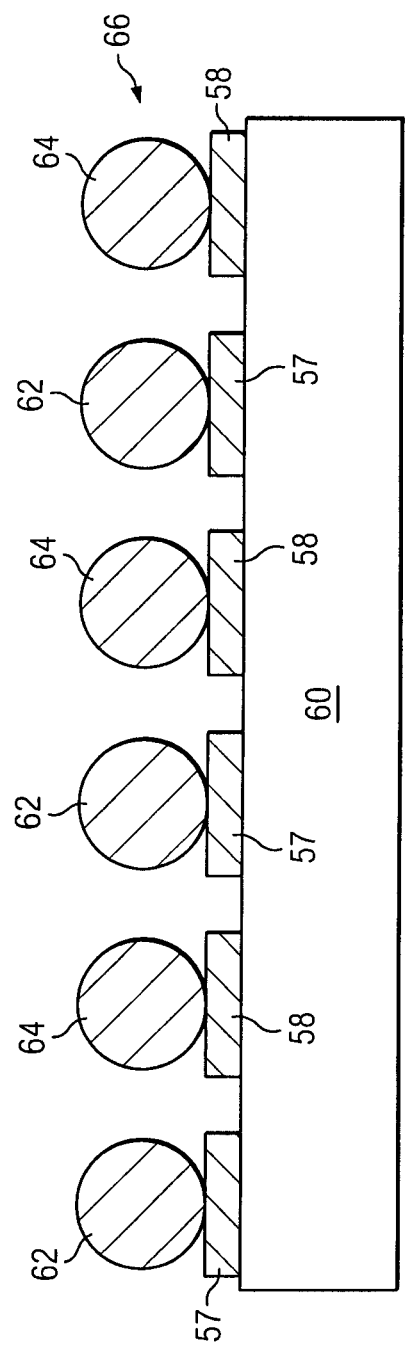
FIG. 10 is a side view of a semiconductor showing one row of source and drain solder bumps for connecting to an array of devices formed on a common SOI substrate.

FIG. 10 shows a wider side view of the alternating pattern of source bond pads 62 and drain bond pads 64 connected in a single row 66 across the top of semiconductor device 60. Additional rows of bond pads are formed atop the die for connecting to an array of devices formed on a common SOI substrate. In one embodiment, the rows of bond pads are interleaved, so that each row has only source bond pads or drain bond pads, arranged so that the rows alternate between source rows and drain rows.

Figure 11:
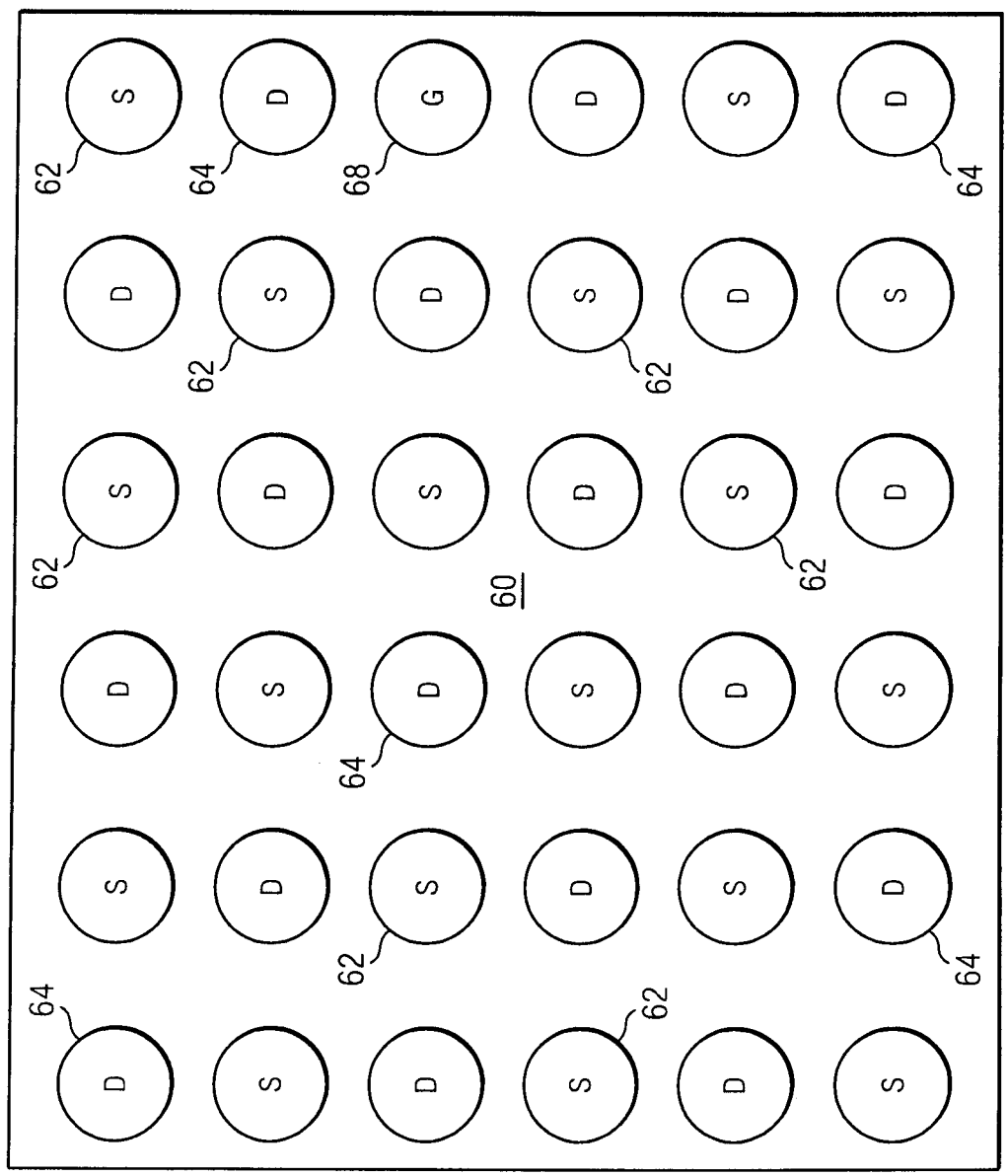
FIG. 11 is a top view of a semiconductor showing source and drain solder bumps arranged in a checkerboard pattern for connecting to an array of devices formed on a common SOI substrate.

FIG. 11 shows a top view with source and drain solder bumps arranged in a checkerboard pattern atop a die for connecting to an array of devices formed on a common SOI substrate. Source bond pads 62 and drain bond pads 64 are shown in a 6×6 checkerboard array on a 9 mm$^2$ die. A single gate bond pad 68 is provided for switching the array. Source, drain, and gate bond pads are made as solder balls, as copper filler bumps, as electroless nickel with gold flash, or as a land grid array.

The placement of the different bond pads in a checkerboard arrangement advantageously shortens the overall conduction paths for the electrical connections between each transistor element and the packaged electrode, lowering the on-resistance of the packaged device. In addition, the checkerboard arrangement causes opposing current flows between any two adjacent source and drain bond pads (excluding diagonals), which has the effect of reducing electrode inductance, as the magnetic fields associated with the adjacent conduction paths tend to cancel each other out. Reducing the electrode inductance advantageously permits higher frequency operation.

Figure 12:
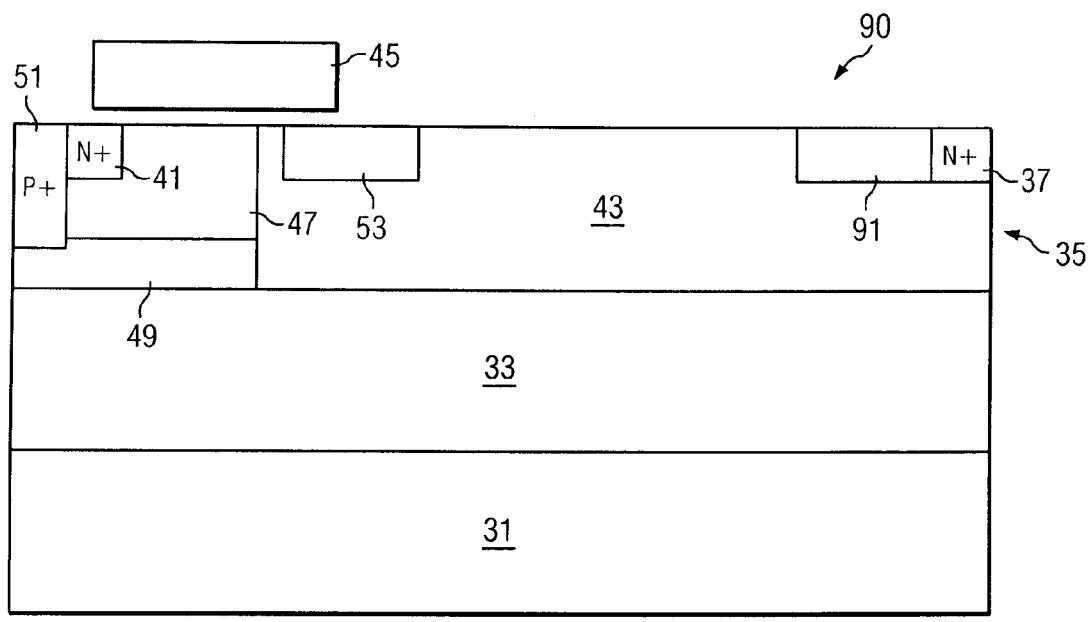
FIG. 12 is a cross-sectional view of a high voltage SOI lateral double diffused MOSFET with dual shallow trench insulators.

FIG. 12 is a cross-sectional view of an embodiment of a high voltage SOI lateral double diffused MOSFET 90 with dual shallow trench insulators. MOSFET 90 is fabricated using the techniques and materials previously disclosed with respect to semiconductor device 30, and so the components of MOSFET 90 are numbered accordingly. MOSFET 90 further includes a second STI 91. In one embodiment, the second STI 91 is formed along a top surface of drift region 43, and is placed adjacent to the drain region 37 and separated from the first STI 53. In this location, STI 91 is positioned to absorb electric fields emanating from the drain region 37 to reduce the probability of avalanche breakdown. STI 91 also ensures that MOSFET 90 sustains its optimal breakdown voltage rating. As in the case of STI 53, the second STI 91 is formed within active silicon layer 35, which has a thickness of about 1 µm. In one embodiment, at least one of STI 53 and STI 91 has a depth less than or equal to about half the thickness of active silicon layer 35. The depth of STI 53 and STI 91 is about 0.25 µm. Advantageously, $RDS_{ON}$ is not substantially affected, because the top segment of drift region 43 that lies between STI 53 and STI 91 remains unchanged and able to provide charge carriers for forward conduction.

Figure 13:
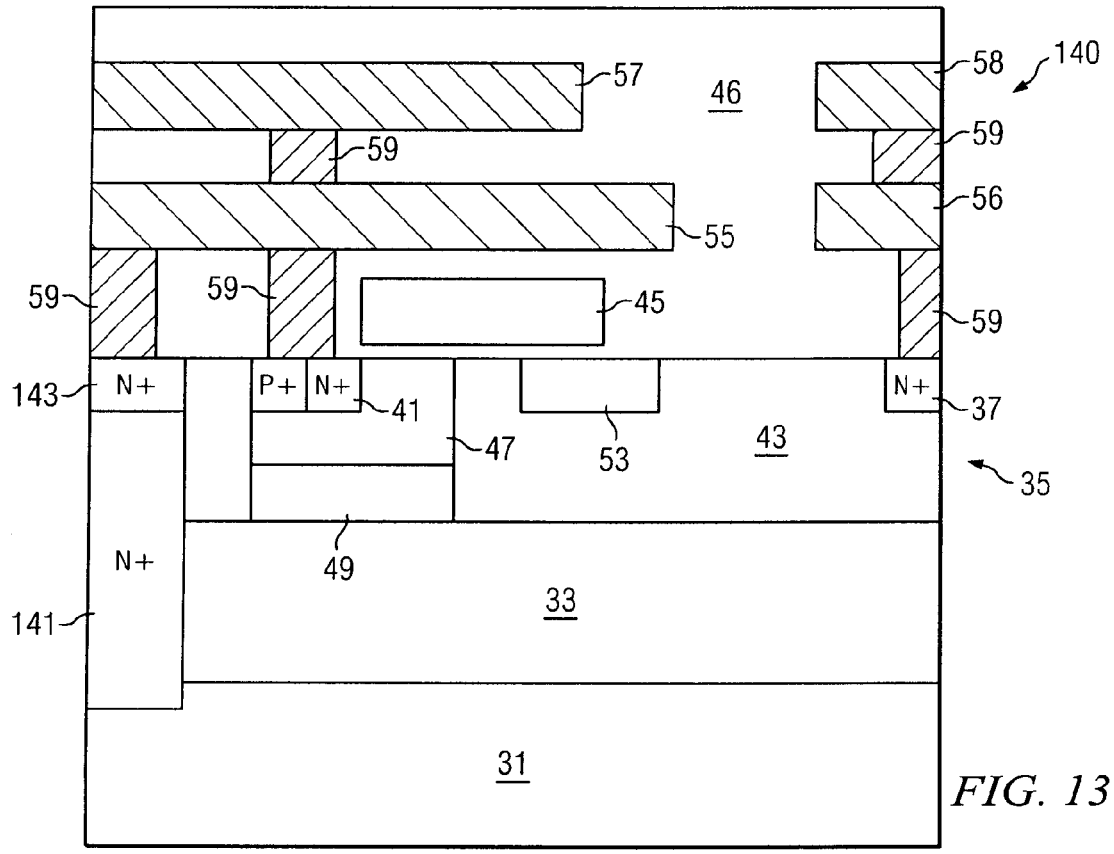
FIG. 13 is a cross-sectional view of a high voltage SOI lateral double diffused MOSFET with shallow trench insulator and source-coupled base layer.

FIG. 13 is a cross-sectional view of a high voltage SOI lateral double diffused MOSFET 140 with shallow trench insulator and a source-coupled base layer. MOSFET 140 is fabricated using the techniques and materials previously disclosed with respect to semiconductor device 30, and so the components of MOSFET 140 are numbered accordingly. In addition, an n+ region 141 extends from active silicon layer 35 through BOX layer 33 and into electrical contact with base layer 31. Region 141 is formed, for example, using methods such as etching, CVD, or ion implantation. Optionally, an n+ ohmic contact 143 is formed at the top surface of active silicon layer 35, as shown, to facilitate connection to conductive metal pillar 59. The conductive structure allows base layer 31 to be grounded by means of a top side connection, and enables MOSFET 140 to sustain a higher $BV_{DSS}$. Regions 141 and 143 can be p-type material and generally have the same doping type as base layer 31.

Figure 14:
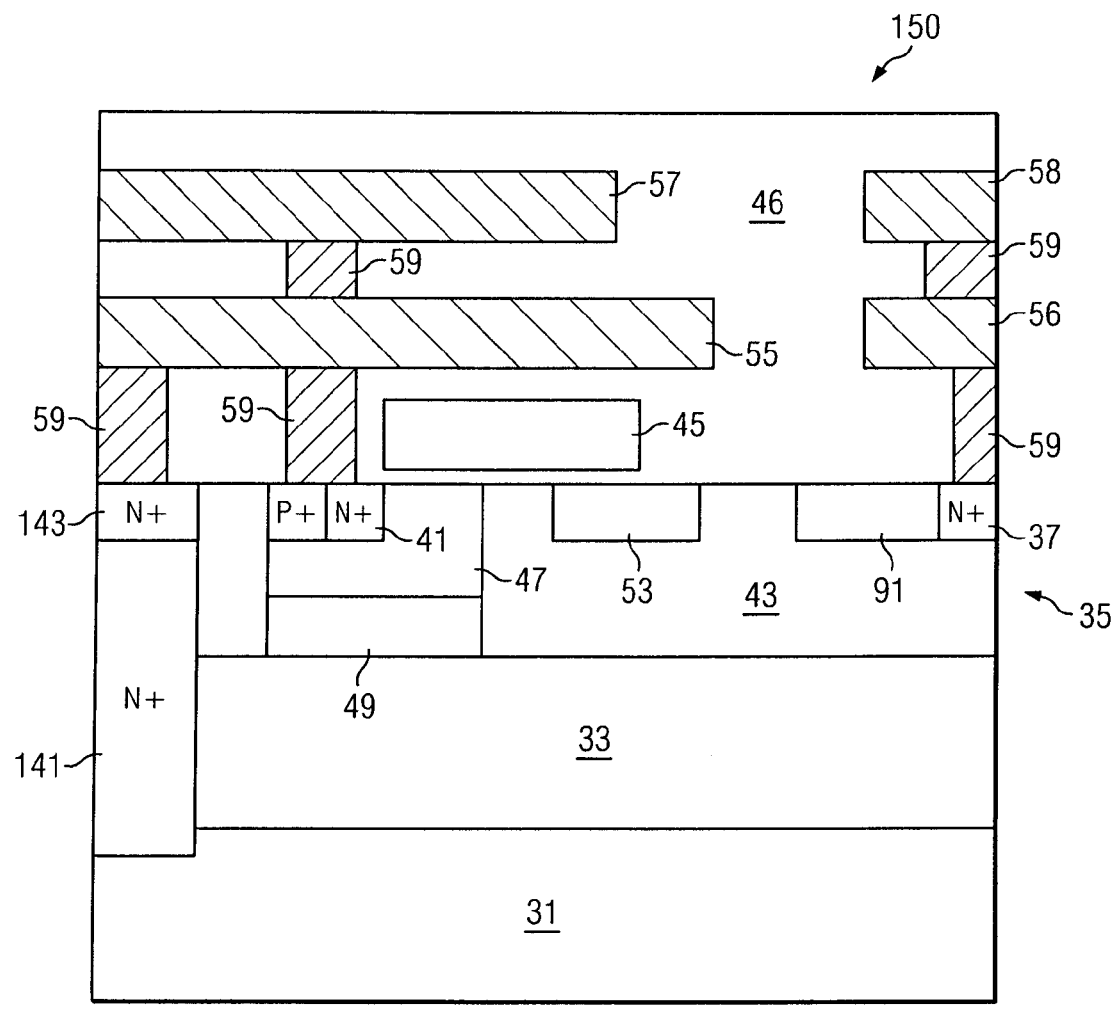
FIG. 14 is a cross-sectional view of a high voltage SOI lateral double diffused MOSFET with dual shallow trench insulators and source-coupled base layer.

FIG. 14 is a cross-sectional view of a high voltage SOI lateral double diffused MOSFET 150 with dual shallow trench insulators and source-coupled base layer. MOSFET 150 is fabricated using the techniques and materials previously disclosed with respect to semiconductor devices 30, 90, and 140, and so the components of MOSFET 150 are numbered accordingly. MOSFET 150 includes the dual STIs 53 and 91, and also has base layer 31 grounded through n+ region 141 and optional n+ ohmic contact 143.

FIGS. 15 through 20 illustrate a sequence of process steps for fabricating one or more of the devices shown and described herein. The process uses an SOI substrate as a fabricating medium, which substrate has characteristics similar to those described with respect to semiconductor device 30, including base layer 31, BOX layer 33, and active silicon layer 35.

Figure 15:
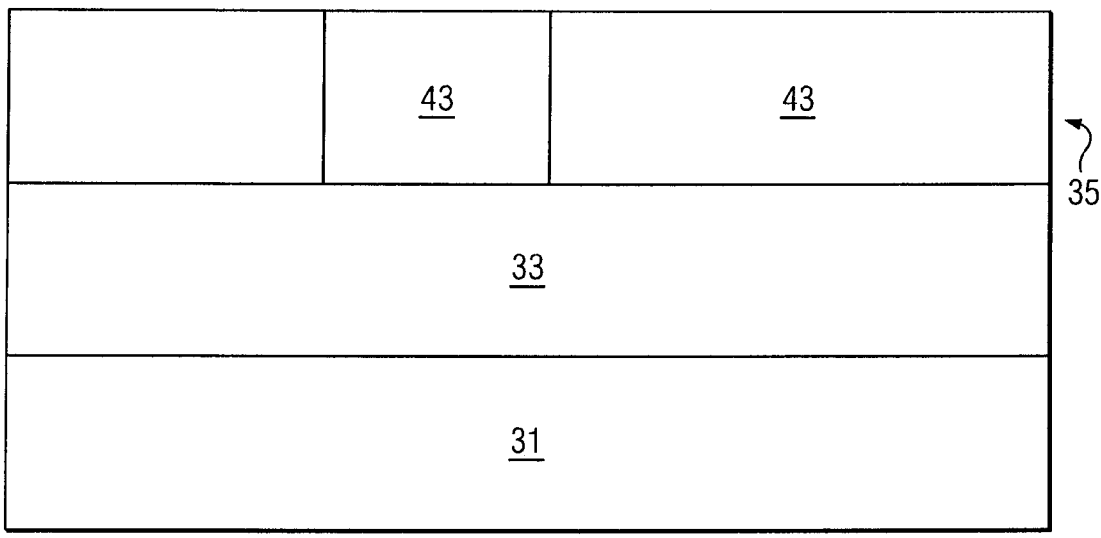
FIG. 15 illustrates process steps for implanting lateral double diffused layers in an active silicon layer.

FIG. 15 illustrates the first two salient process steps for fabricating the semiconductor device. The figure shows lateral double diffused layers LDD1 and LDD2 being implanted into active silicon layer 35. LDD1 is implanted first using a fixed mask layer and fixed doping concentration of a carrier type opposite that of active silicon layer 35. The length of the LDD1 implant runs from the drain edge of the SOI to the left-most edge of the LDD1 block. LDD2 is implanted next, and has a higher doping concentration of the same carrier type as LDD1. The mask size and doping concentration used for the LDD2 implant is selected to achieve a desired $BV_{DSS}$ and $RDS_{ON}$ for the device. The length of the LDD2 implant coincides with the length of the LDD1+LDD2 block. For n-type diffusion, the diffused ion may be a phosphorus.

Figure 16:
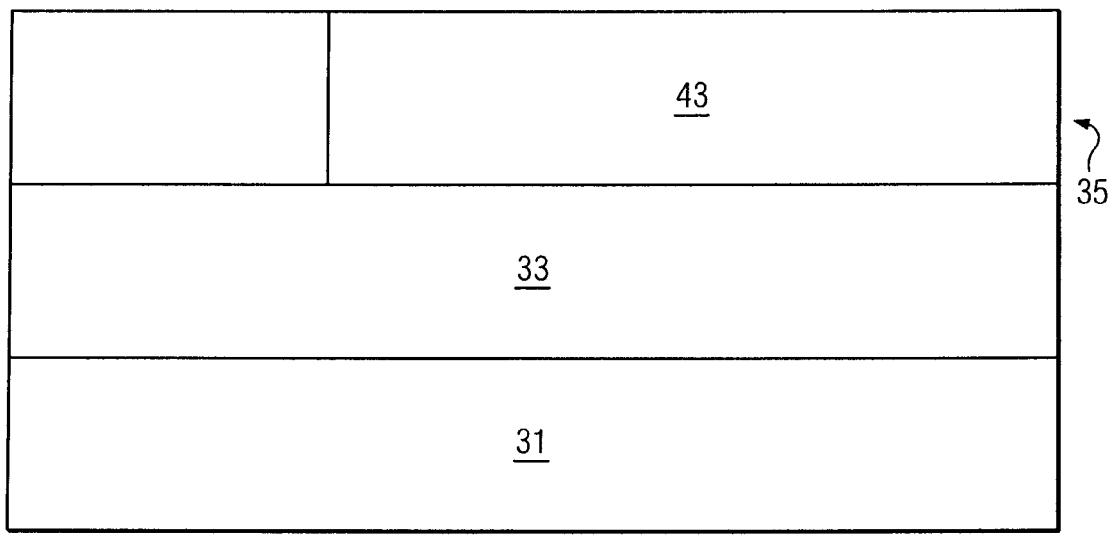
FIG. 16 illustrates a process step for thermally diffusing two lateral double diffused layers in the active silicon layer.

FIG. 16 illustrates the next salient process step. The LDD1 and LDD2 layers are diffused using a thermal drive to create drift region 43, wherein a doping gradient forms from the drain edge of the LDD1 and LDD2 layers toward the source edge of the LDD1 and LDD2 layers. In one embodiment, the doping concentration of the drift region is greatest at the drain end and least at the source end.

Figure 17:
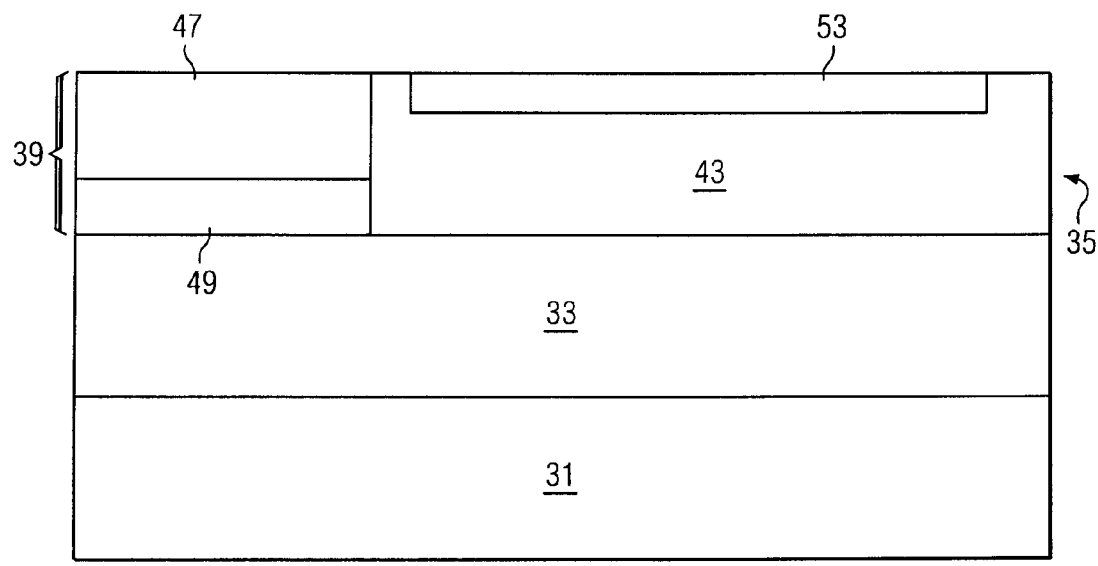
FIG. 17 illustrates process steps for forming a shallow trench insulator along a thermally diffused drift region.

FIG. 17 illustrates the next salient process steps for forming the semiconductor device. First, STI 53 is formed along the thermally diffused drift region 43. First, a trench is located for the STI using a mask and etch technique. After the trench is formed to a desired depth, it is filled with an insulator using a vapor deposition or other process.

Figure 18:
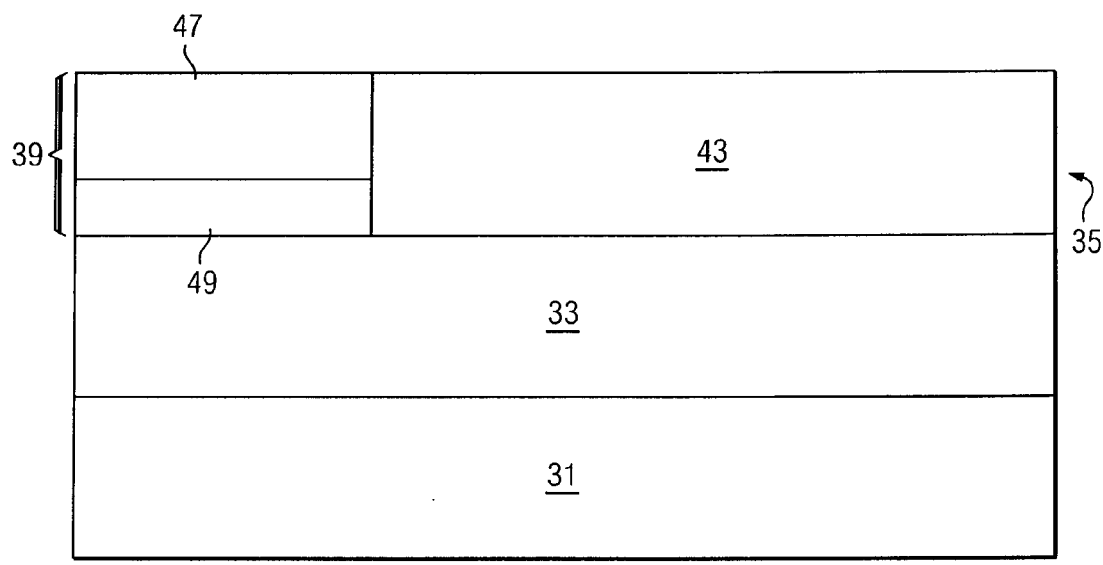
FIG. 18 illustrates process steps for forming a co-implant region in the active silicon layer.

FIG. 18 illustrates the next two salient process steps for forming the semiconductor device. In these steps, co-implant region 39 is formed from the source end of drift region 43 to the source end of the device. First, a lightly doped base material 47 (p-base) of the same carrier type as active silicon layer 35 is implanted in the co-implant region, for example, using a low-energy implant technique. Next, a highly doped material of the same carrier type as the active silicon layer is implanted more deeply into the active silicon layer, for example, using a high-energy implant technique, to form a highly doped buried layer 49. For p-type implants, the implanted ion may be a boron. In an alternative embodiment, these two steps may be reversed.

Figure 19:
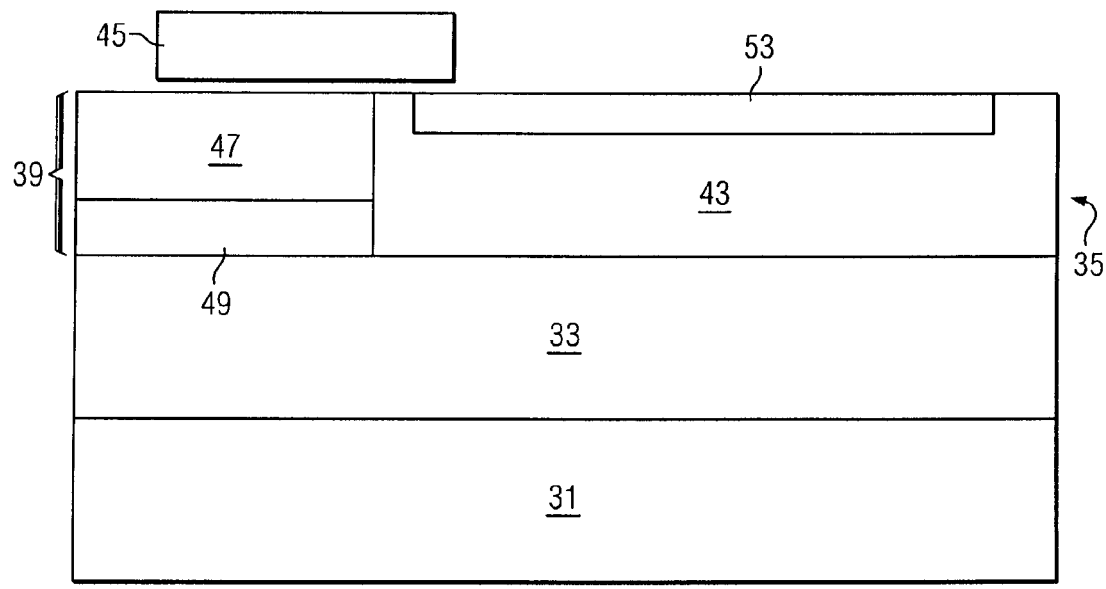
FIG. 19 illustrates process steps for forming a poly gate overlapping a co-implant region and shallow trench insulator.

FIG. 19 illustrates the next salient process steps for forming the semiconductor device. First, an oxide layer is formed above active silicon layer 35. Then, polysilicon gate region 45 is formed in the oxide layer. The poly gate is formed, for example, from a heavily doped n-type polysilicon layer underneath a tungsten silicide layer and located to at least partially overlap both co-implant region 39 and STI 53.

Figure 20:
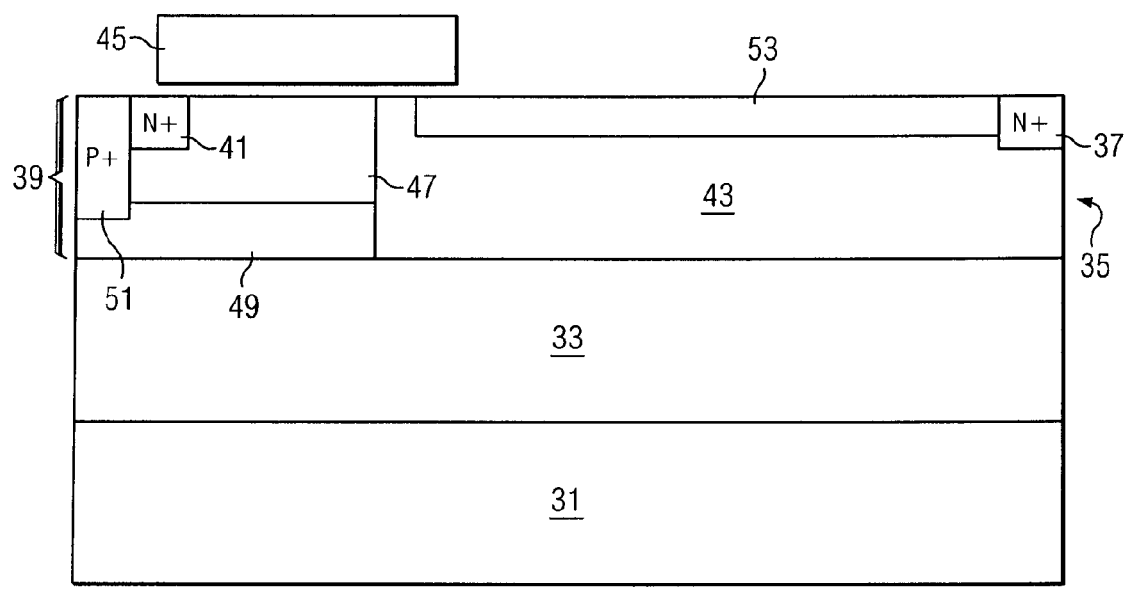
FIG. 20 illustrates process steps for forming n+ and p+ regions at the source and drain ends.

FIG. 20 illustrates the final steps of the salient process steps for forming the semiconductor device. In these steps, drain region 37 and source region 41, of a carrier type opposite the active silicon layer, are implanted in active silicon layer 35 at the drain end and source end of the device, as shown. Also, one or more plugs or contacts of the same carrier type as the active silicon layer is implanted at the source end of the device adjacent to source region 41.

Figure 21:
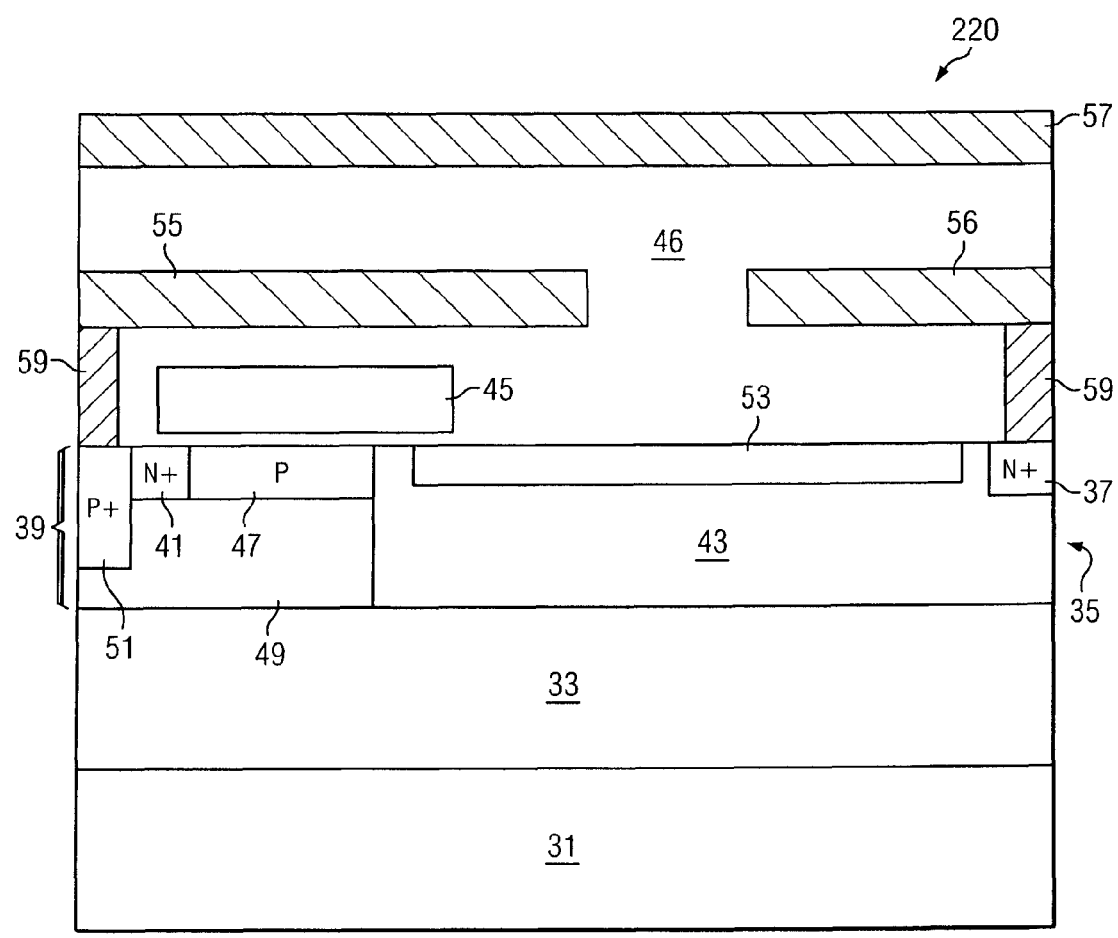
FIG. 21 is a cross-sectional view of a half unit cell showing typical vertical dimensions.

FIG. 21 is a cross-sectional view of one embodiment of a half unit cell of semiconductor device 220 with typical vertical dimensions for the component layers of the device. In this embodiment, BOX layer 33 and active silicon layer 35 are each about 1 µm thick. The STI depth is about 0.25 µm. The vertical distance from the active silicon layer 35 to the first elevation is about 2 µm, and the vertical distance from the first elevation to the second elevation is also about 2 µm.

Figure 22:
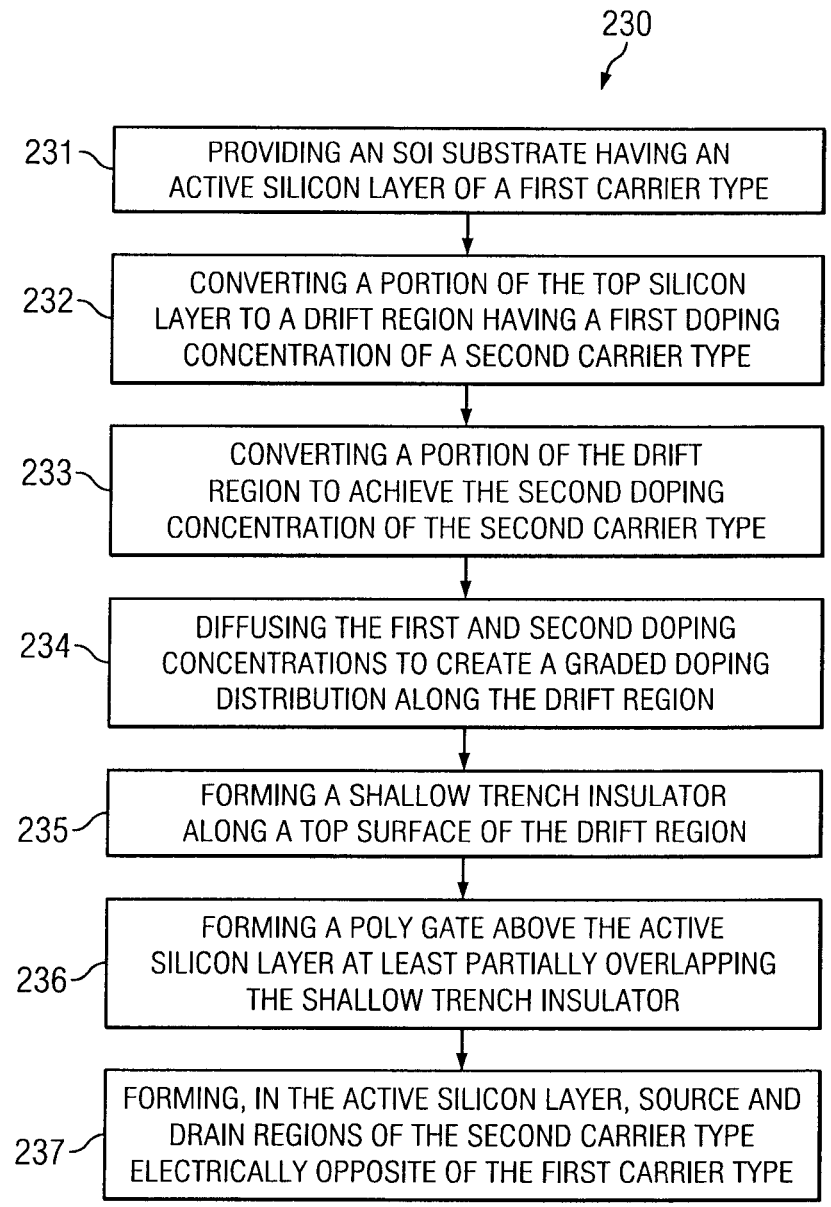
FIG. 22 is a process flow diagram illustrating a method for fabricating a high power MOSFET.

FIG. 22 is a process flow diagram illustrating one embodiment of a method 230 for fabricating a high power MOSFET. The steps of method 230 represent salient steps in a fabrication process, and should be interpreted in accordance with the foregoing descriptions and appended drawings. In step 231, an SOI substrate is provided having an active silicon layer of a first carrier type. In step 232, a portion of the active silicon layer is converted to a drift region having a source, drain, and a first doping concentration of the second carrier type. In step 233, a portion of the drift region is converted to achieve a second doping concentration of the second carrier type. In step 234, the first and second doping concentrations are thermally diffused to create a graded doping distribution along the drift region. In step 235, a shallow trench insulator is formed along a top surface of the drift region. In step 236, a polysilicon gate is formed above the active silicon layer so that it at least partially overlaps the shallow trench insulator. In step 237, source and drain regions of the second carrier type are formed in the active silicon layer at the source end and the drain end of the drift region.

Figure 23:
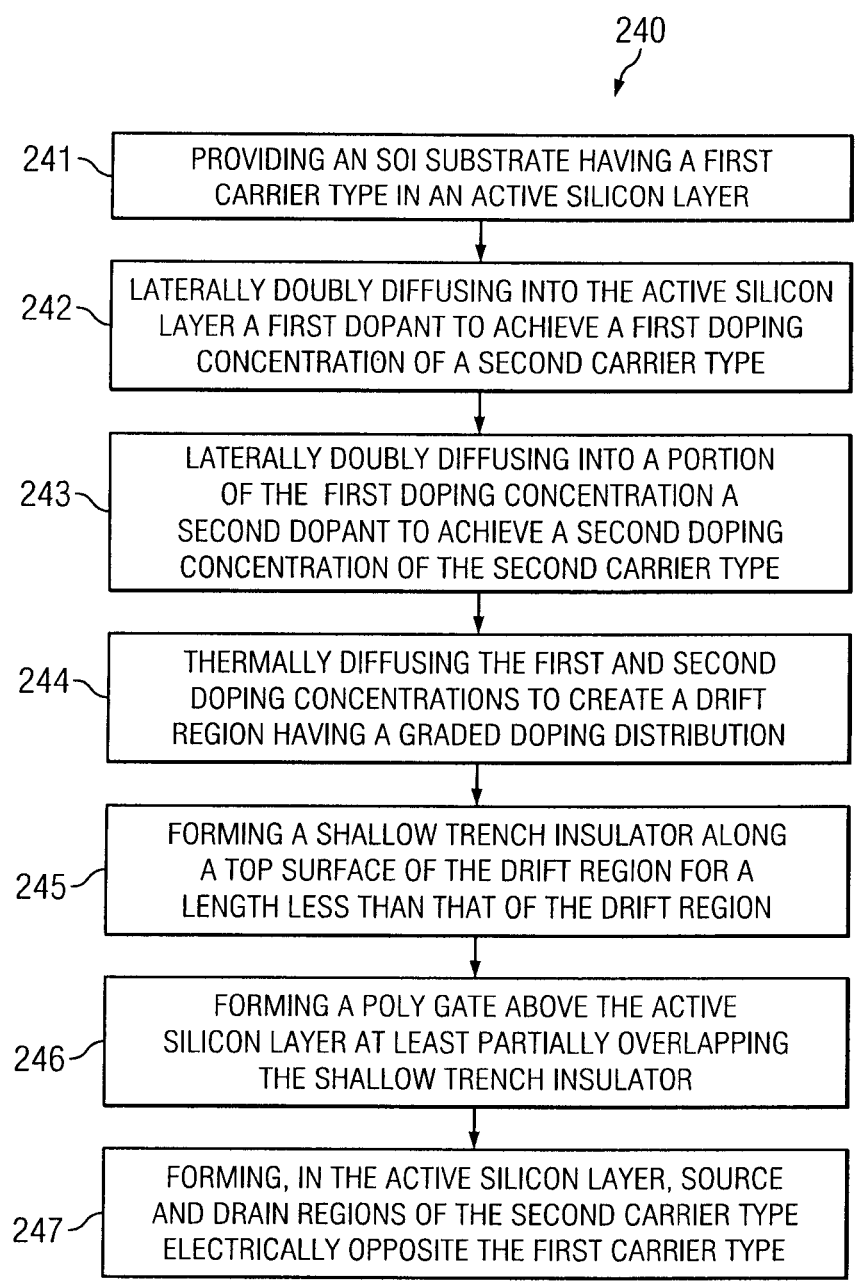
FIG. 23 is a process flow diagram illustrating another embodiment of a method for fabricating a high power MOSFET.

FIG. 23 is a process flow diagram illustrating another embodiment of a method 240 for fabricating a high power MOSFET. The steps of method 240 represent salient steps in a fabrication process, and should be interpreted in accordance with the foregoing descriptions and appended drawings. In step 241, an SOI substrate is provided having a first carrier type in the active silicon layer. In step 242, a first dopant is laterally doubly diffused into the active silicon layer to achieve a first doping concentration of a second carrier type. In step 243, a second dopant is laterally doubly diffused into a portion of the first doping concentration to achieve a second doping concentration of the second carrier type. In step 244, the first and second doping concentrations are thermally diffused to create a drift region having a graded doping distribution from the source end to the drain end. In step 245, a shallow trench insulator is formed along a top surface of the drift region for a length less than that of the drift region. In step 246, a polysilicon gate is formed above the active silicon layer at least partially overlapping the shallow trench insulator. In step 247, source and drain regions of the second carrier type are formed in the active silicon layer at the source end and the drain end of the drift region.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a buried oxide layer over the substrate;
   forming an active silicon layer over the buried oxide layer;
   forming a drain region in the active silicon layer;
   forming a laterally double diffused (LDD) drift region in the active silicon layer adjacent to the drain region using a thermal drive to create a graded doping distribution;
   forming a co-implant region in the active silicon layer including a doped buried layer adjacent to the buried oxide layer, the co-implant region further including a doped base layer formed over the doped buried layer and having a doping concentration less than the doped buried layer;
   forming a source region in the co-implant region;
   forming a first shallow trench insulator (STI) along a surface of the LDD drift region with a length less than a length of the LDD drift region;
   forming a second STI along the surface of the LDD drift region adjacent to the drain region and separated from the first STI; and
   forming a polysilicon gate region over the active silicon layer between the source region and LDD drift region and at least partially overlapping the first STI.

2. The method of claim 1, wherein a first end of the first STI terminates under the polysilicon gate region and a second end of the first STI terminates within the LDD drift region.

3. The method of claim 1, further including:
   forming an insulating layer over the active silicon layer;
   forming a source metal layer at a first elevation within the insulating layer and electrically connected to the source region; and
   forming a first drain metal layer at the first elevation within the insulating layer and electrically connected to the drain region.

4. The method of claim 3, further including:
   forming a plurality of drain bumps over the substrate and electrically connected to the first drain metal layer; and
   forming a plurality of source bumps electrically connected to the source metal layer.

5. The method of claim 1, wherein forming the first STI includes:
   forming a trench in the LDD drift region; and
   depositing an insulating material in the trench.

6. A method of making a semiconductor device, comprising:
   providing a substrate;
   forming a drain region over the substrate;
   forming a drift region with a graded doping distribution over the substrate adjacent to the drain region using a thermal drive;
   forming a co-implant region over the substrate including a doped buried layer adjacent to the drift region and a doped base layer formed over the doped buried layer;
   forming a source region in the co-implant region;
   forming a first shallow trench insulator (STI) along a surface of the drift region with a length less than a length of the drift region; and
   forming a gate region over the substrate between the source region and drift region.

7. The method of claim 6, wherein a first end of the first STI terminates under the gate region and a second end of the first STI terminates within the drift region.

8. The method of claim 6, further including forming a second STI along the surface of the drift region adjacent to the drain region and separated from the first STI.

9. The method of claim 6, further including:
   forming an insulating layer over the substrate;
   forming a source metal layer at a first elevation within the insulating layer and electrically connected to the source region; and
   forming a first drain metal layer at the first elevation within the insulating layer and electrically connected to the drain region.

10. The method of claim 9, further including:
    forming a plurality of drain bumps over the substrate and electrically connected to the first drain metal layer; and
    forming a plurality of source bumps electrically connected to the source metal layer.

11. The method of claim 6, wherein forming the first STI includes:
    forming a trench in the drift region; and
    depositing an insulating material in the trench.

12. The method of claim 6, wherein the substrate includes an insulating layer.

* * * * *